United States Patent
Birns et al.

(10) Patent No.: US 8,719,749 B2
(45) Date of Patent: May 6, 2014

(54) TIMER MATCH DITHERING

(75) Inventors: Neil E. Birns, Cupertino, CA (US); Craig A. MacKenna, Los Gatos, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/563,431

(22) Filed: Jul. 31, 2012

(65) Prior Publication Data

US 2014/0035648 A1    Feb. 6, 2014

(51) Int. Cl.
*G06F 9/455* (2006.01)

(52) U.S. Cl.
USPC .......................... 716/113; 716/101; 716/132

(58) Field of Classification Search
USPC .......................................... 716/101, 113, 132
See application file for complete search history.

(56) References Cited

U.S. PATENT DOCUMENTS

| | | | |
|---|---|---|---|
| 7,227,476 B1 | 6/2007 | Wong | |
| 7,791,387 B1 | 9/2010 | Wong | |
| 8,140,925 B2 * | 3/2012 | Bellofatto et al. | 714/731 |
| 2007/0047272 A1 | 3/2007 | Kris | |
| 2009/0005913 A1 | 1/2009 | Fernandez et al. | |

OTHER PUBLICATIONS

"Microcontrollers for TV and Video (MTV)", Product Data Sheet, Philips Semiconductors, Mar. 22, 1996.

* cited by examiner

*Primary Examiner* — Thuan Do (57) ABSTRACT

A counter/timer circuit and a method of operating the counter/timer circuit are described. In one embodiment, a method of operating a counter/timer circuit involves determining a match condition by comparing a count value of the counter/timer circuit with a value stored in a match register of the counter/timer circuit and delaying an assertion of the match condition based on a value programmed in a match companion register of the counter/timer circuit. The match companion register is associated with the match register. Other embodiments are also described.

20 Claims, 5 Drawing Sheets

TIMER MATCH DITHERING

Counter/timer circuits can provide timing information and counting information. A counter/timer circuit typically has one or more programmable match registers. During a counter/timer cycle, a counter value of the counter/timer circuit is continuously compared to the values contained in the match registers to determine whether a match condition has occurred. In response to the match condition, one or more appropriate operations can be triggered.

In traditional counter/timer circuits, the finest resolution that can be achieved in generating a match condition and affecting a response is one period of the counter/timer clock. However, the resolution of one counter/timer clock period is insufficient for applications that require higher timer match resolutions. Although timer match resolutions can be improved by increasing the counter clock rate, simply increasing the counter clock rate to the degree required for a specific resolution is typically not feasible. Therefore, there is a need for improving timer match resolution in a counter/timer circuit without increasing the counter clock rate of the counter/timer circuit.

A counter/timer circuit and a method of operating the counter/timer circuit are described. In one embodiment, a method of operating a counter/timer circuit involves determining a match condition by comparing a count value of the counter/timer circuit with a value stored in a match register of the counter/timer circuit and delaying an assertion of the match condition based on a value programmed in a match companion register of the counter/timer circuit. The match companion register is associated with the match register. Other embodiments are also described.

In an embodiment, a counter/timer circuit includes a counter, a match module configured to determine a match condition by comparing a count value of the counter with a value stored in a match register of the counter/timer circuit, and a dither module configured to delay an assertion of the match condition based on a value programmed in a match companion register of the counter/timer circuit. The match companion register is associated with the match register.

Other aspects and advantages of the present invention will become apparent from the following detailed description, taken in conjunction with the accompanying drawings, illustrated by way of example of the principles of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
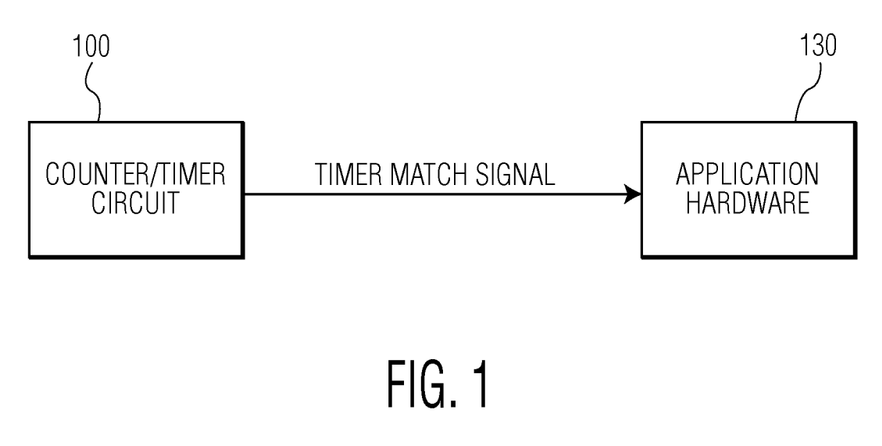
FIG. 1 is a block diagram showing a counter/timer circuit with application hardware in accordance with an embodiment of the invention.

FIG. 1 is a block diagram showing a counter/timer circuit 100 with application hardware 130 in accordance with an embodiment of the invention. The counter/timer circuit can be designed to provide timing information, counting information, output signal modulation and/or input capture results for various applications. In an embodiment, the counter/timer circuit is a universal counter/timer, which can be configured to provide output signals for a particular application, such as motor control, without having to redesign the circuit for each application.

In an example set of operations, the counter/timer circuit 100 counts up to a counter limit, then either reverses direction and counts back to zero or is immediately reset to zero. At that point, the counter/timer circuit will begin counting up again. Each time the counter/timer circuit returns to zero and resumes up-counting, it marks the end of one counter/timer cycle and the beginning of a new one. The counter/timer circuit typically has one or more programmable match registers. During each counter/timer cycle, the counter/timer output is continuously compared to the values contained in the various programmable match registers to determine whether a match condition has occurred. A match condition occurs whenever the counter value is equal to the value stored in one of these match registers. In an embodiment, the counter/timer circuit asserts a match condition by generating a timer match signal, which can be used to trigger one or more appropriate operations.

In the embodiment depicted in FIG. 1, the counter/timer circuit 100 operates with the application hardware 130. The application hardware is configured to be triggered by the timer match signal from the counter/timer circuit to perform a single operation or combinations of operations. The application hardware can take any number of actions in response to the occurrence of a match condition in the counter/timer circuit, including toggling an output pin, requesting an interrupt, changing a state variable, changing direction of count, etc. In an embodiment, the application hardware creates a pulse-width modulated waveform (PWM) in response to the timer match signal from the counter/timer circuit.

In an embodiment, the counter/timer circuit 100 provides a fractional portion to the timer/counter match values using a "dither" technique. Using the dither technique, the average match value that is integrated over a number of timer cycles can achieve a greater resolution than the resolution of a timer clock period that is achievable by a conventional counter/timer circuit. The dither technique involves delaying the assertion of a timer match signal by one timer clock every N timer cycles out of M timer cycles, where N and M are integers. In an embodiment, M is equal to 16. The value of N is configurable, for example, in software. The one-clock delay in the assertion of a match condition can occur regardless of the direction of count. By delaying the recognition of a match condition by one clock every N timer cycles out of M timer cycles, the average resolution can be increase to 1/Mth of a clock period. For example, a match register may contain a match value of "195." By delaying the recognition of a match condition so that it occurs one count later (i.e. on count "196") three out of every sixteen times that the counter clocks up to "195," the effective match value, on average, is $195\tfrac{3}{16}$. In some embodiments, the counter/timer circuit 100 exercises further control over the delay of match recognition using pre-defined events. Specifically, the counter/timer circuit allows a user to qualify, define or specify whether or not the dithering process can occur in any particular counter/timer cycle based on a certain event or a combination of events which may have occurred at any time during the previous counter cycle. Also, in other embodiments, the delay of the assertion of a timer match signal may be more than one timer clock.

Figure 2:
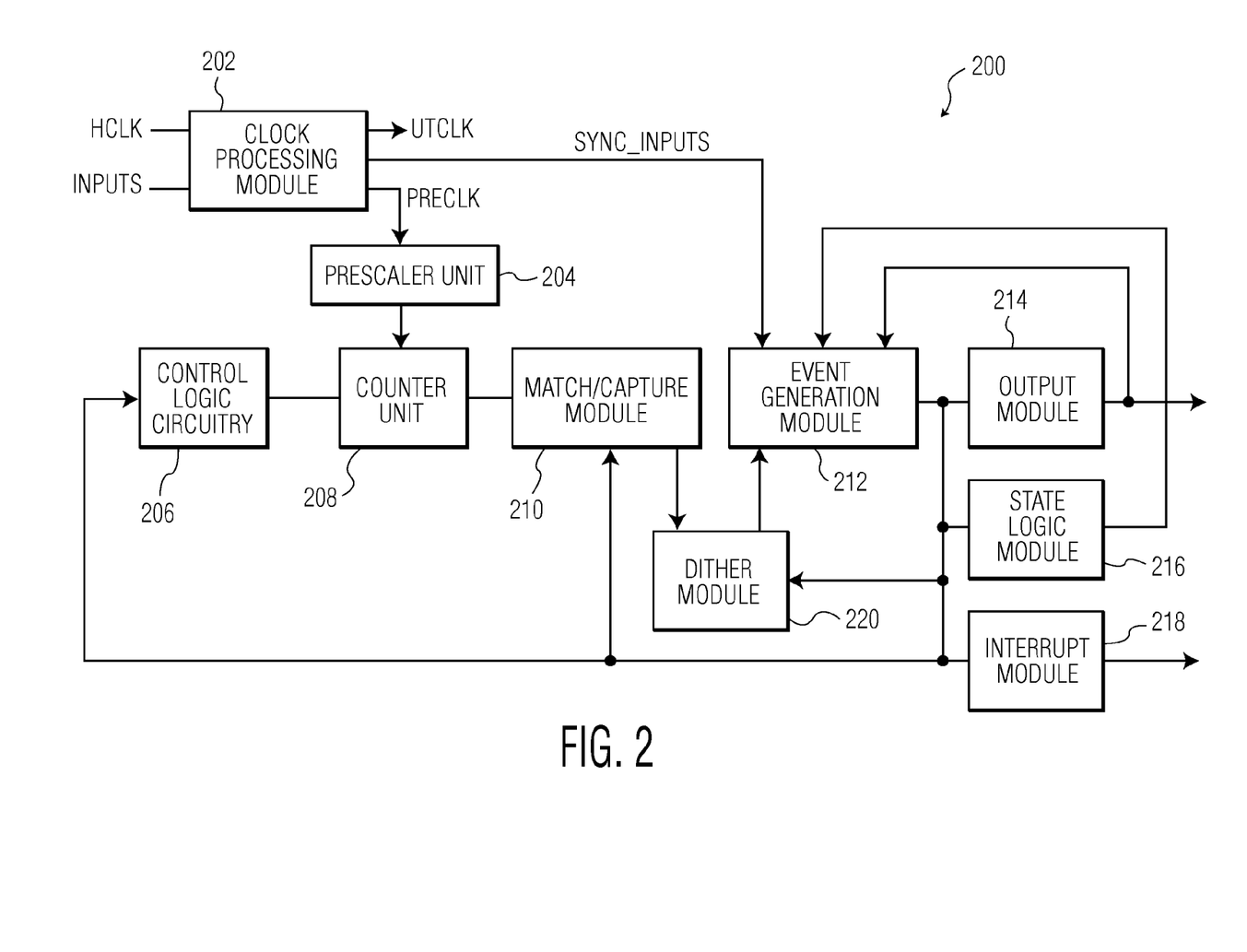
FIG. 2 is a block diagram of a counter/timer circuit in accordance with an embodiment of the invention.

FIG. 2 depicts an embodiment of the counter/timer circuit 100 that uses an event-based timer match dither technique. As shown in FIG. 2, the counter/timer circuit 200 includes a clock processing module 202, a prescaler unit 204, control logic circuitry 206, a counter unit 208, a match/capture module 210, an event generation module 212, an output module 214, state logic module 216, an interrupt module 218 and a dither module 220. Although the components of the counter/timer circuit are illustrated in FIG. 2 as being separate modules, these modules are typically integrated into a single counter/timer circuit.

The clock processing module 202 of the counter/timer circuit 200 includes two inputs to receive an external clock signal "HCLK" and a multiplicity of input signals "INPUTS" and outputs to output an internal clock signal "UTCLK" for various components of the counter/timer circuit, a multiplicity of synchronized input signals "SYNC_INPUT" for the event generation module 212 and a prescaler clock signal "PRECLK" for the prescalers. In some embodiments, the UTCLK and PRECLK clock signals differ from the external HCLK clock signal with respect to frequency. However, in other embodiments, one or both of the UTCLK and PRECLK clock signals may be equivalent to the external HCLK clock signal with respect to frequency.

The prescaler unit 204 of the counter/timer circuit 200 operates to produce one or more clock signals for the counter unit 208 using the PRECLK clock signal from the clock processing module 202. The prescaler unit includes one or more prescalers, similar to the counter unit, which includes one or more counters. In an embodiment, the number of prescalers included in the prescaler unit is equal to the number of counters included in the counter unit. Each prescaler is configured to provide a clock signal to the counter connected to that prescaler. Thus, depending on the number of counters in the counter unit, the prescalers generate a corresponding number of clock signals to be used by the counters.

The control logic circuitry 206 of the counter/timer circuit 200 operates to produce control signals to control at least one counter of the counter unit 208. The control signals determine when the counter is incremented, cleared, and loaded. The control logic circuitry includes an input to receive event signals generated by the event generation module 212. The control logic circuitry is configured to provide appropriate control signals to the counter unit in response to different event signals, i.e., when certain events occur.

The counter unit 208 of the counter/timer circuit 200 operates to produce one or more running count values. As mentioned above, the counter unit includes one or more counters, depending on the configuration of the counter/timer circuit. In an embodiment, the counter unit is configurable to function as A B-bit counters, where A and B are positive integers. In this embodiment, each counter of the counter unit is connected to one of the prescalers of the prescaler unit 204 to receive the clock signal from that prescaler. Each counter is also connected to the control logic circuitry 206 to receive the control signals from the control logic circuitry. Thus, each counter maintains a count value using the clock signal from the connected prescaler and using the control signals from the control logic circuitry.

The match/capture module 210 of the counter/timer circuit 200 is connected to the counter unit 208 to receive one or more counter values. The match/capture module is configured to store values that specify match or capture conditions, depending on one of the bits in register mode registers (not shown). The match/capture module performs either the match or capture function using the stored values for the match or capture conditions.

Figure 3:
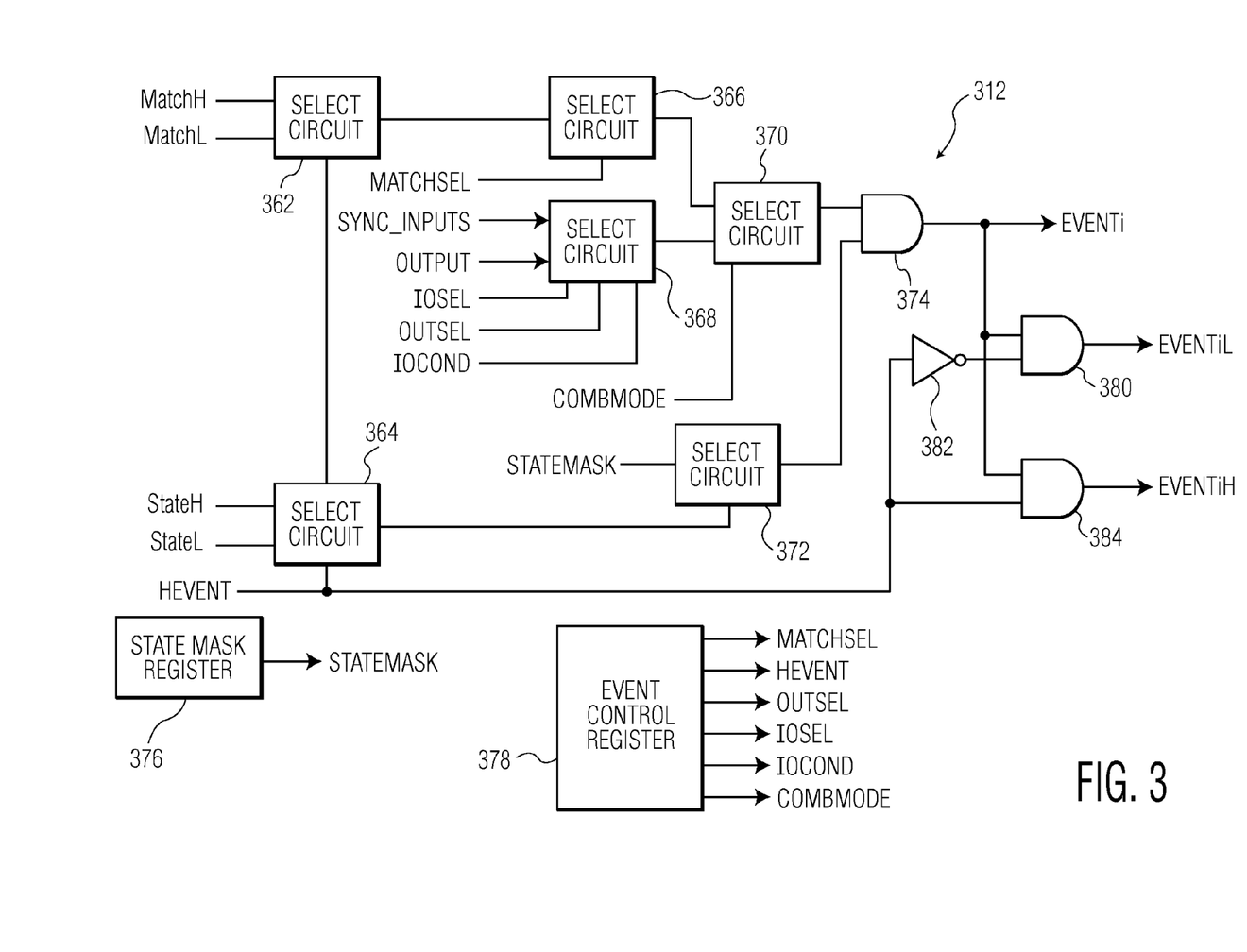
FIG. 3 is a block diagram of an event generation module of the counter/timer circuit depicted in FIG. 2 in accordance with an embodiment of the invention.

The event generation module 212 of the counter/timer circuit 200 generates event signals depending on counter matches, input/output edges and state values. The event signals from the event generation module can switch outputs, require interrupts and change state values. FIG. 3 depicts an embodiment of the event generation module 212. The event generation module 312 in FIG. 3 includes a multiplicity of the individual event units shown in FIG. 3, each of which includes select circuits 362, 364, 366, 368, 370 and 372 and an AND logic gate 374. The individual event units use signals from a state mask register 376 and an event control register 378. The state mask register 376 provides STATEMASK signal, as explained below. The event control register 378 provides MATCHSEL, HEVENT, OUTSEL, IOSEL, IOCOND and COMBMODE signals, as also explained below.

The select circuit 362 includes two sets of inputs to receive "MatchH" and "MatchL" signals from the match/capture module 210. The select circuit 362 includes another input to receive a HEVENT signal from the state mask register 376, which controls the selection of either MatchH signals or MatchL signals from the match/capture module 210 for the select circuit 362. Similarly, the select circuit 364 also includes two inputs to receive two state values, a "StateH" value and a "StateL" value, from the state logic circuitry 216, which includes registers to store these state values. These state variables or values, i.e., the StateH and StateL values, indicate the current states of the applications of the counters of the counter unit 208. The select circuit 364 also includes another input to receive the HEVENT signal from the event control register 378, which controls the selection of either the StateH value or the StateL value to be sent to the select circuit 372.

The output of the select circuit 362 is connected to the input of the select circuit 366, which also has an input to receive a MATCHSEL value from the event control register 378. The MATCHSEL value selects one of the match signals from a match/capture module associated with the current event (if any). Thus, the select circuit 366 outputs the match signal selected by the MATCHSEL value. The output of the select signal 366 represents the "match component" of this event, and is connected to an input of the select circuit 370.

The state-value output from the select circuit 364 is connected to an input of the select circuit 372, which also has an input to receive the STATEMASK value from the state mask register 376. The select circuit 372 outputs the bit of the STATEMASK value that is selected by the state value from select circuit 364. This output is one of the two inputs of the AND logic gate 374 that produces the event output of this event unit.

The select circuit 368 includes a set of inputs to receive the synchronized input signals, i.e., the SYNC_INPUT signals, from the clock processing module 202 and a set of inputs to receive the output signals OUTPUT from the output module 214. The select circuit 368 further includes inputs to receive IOSEL, OUTSEL and IOCOND signals from the event control register 378. The OUTSEL signal selects either the synchronized input signals or the output signals of the counter/timer circuit 200, as an ingredient of this event. The IOSEL value selects a particular input or output as an ingredient of this event. The IOCOND value controls which state of the selected input or output signal enables this event: a low level, rising edge, falling edge, or high level. The output of the select circuit 368 represents the "I/O component" of this event, and is connected to an input of the select circuit 370.

The select circuit 370 includes two inputs to receive the outputs from the select circuits 366 and 368. The select circuit 370 further uses the COMBMODE value from the event control register 378, which controls the selection of how these match and I/O components are used or combined from the following selections: OR (match and/or I/O component), MATCH (match component only), IO (I/O component only) and AND (simultaneous match and I/O component). The output of the select circuit 370 is connected to an input of the AND logic gate 374.

The AND logic gate 374 receives the outputs from the select circuits 370 and 372. When the selected match/IO event occurs, and the (selected L or H) state is enabled for this event by the event state mask register for this event, the AND logic gate outputs an EVENTi signal, which can be used to switch outputs, request interrupts, start, stop, or limit the counter(s), and change state values. The EVENTi signal is further differentiated into an EVENTiL signal that is asserted if the HEVENT bit for this event is 0 using an AND logic gate 380 on the EVENTi signal and an inverted HEVENT bit from an inverter 382, which inverts the HEVENT bit, and an EVENTiH signal that is asserted if the HEVENT bit for this event is 1 using an AND logic gate 384 on the EVENTi signal and the HEVENT bit.

Turning back to FIG. 2, the output module 214 of the counter/timer circuit 200 is configured to output one or more signals out of the counter/timer circuit. In an embodiment, the output module outputs the signal based on an event from the event generation module 212. The state logic module 216 of the counter/timer circuit 200 is configured to generate a state value. The interrupt module 218 of the counter/timer circuit 200 operates to present an interrupt request to an associated processor.

The dither module 220 of the counter/timer circuit 200 implements the event-based timer match dither technique. The dither module 220 can provide a fractional portion to the timer/counter match values. Specifically, the dither module 220 delays the assertion of a timer match signal by one timer clock every N timer cycles out of M timer cycles, where N and M are integers. By delaying the recognition of a match condition by one clock every N timer cycles out of M timer cycles, the average resolution can be increase to 1/Mth of a clock period. In addition, the dither module 220 allows a user to qualify, define or specify whether or not the dithering process can occur in any particular counter/timer cycle based on a certain event or a combination of events which may have occurred at any time during the previous counter cycle.

Figure 4:
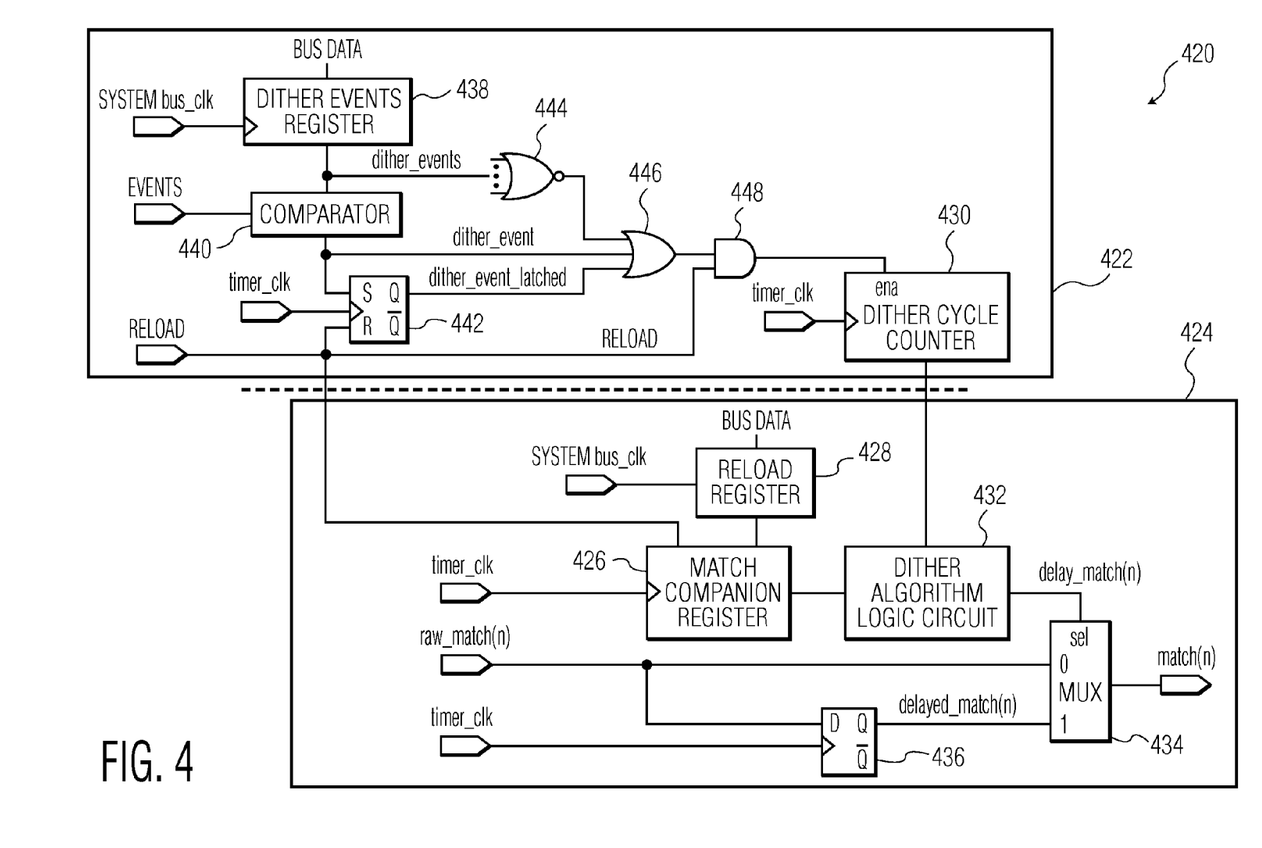
FIG. 4 is a block diagram of a dither module of the counter/timer circuit depicted in FIG. 2 in accordance with an embodiment of the invention.

FIG. 4 depicts an embodiment of the dither module 220. As shown in FIG. 4, the dither module 420 includes at least one dither engine 422 and at least one dither algorithm component 424. In particular, each timer/counter of the counter unit 208 of the counter/timer circuit 200 has a corresponding dither engine and every match register of the match/capture module 210 of the counter/timer circuit 200 has a corresponding dither algorithm component.

The dither algorithm component 424 in FIG. 4 includes a match companion register 426 and a reload register 428. In an embodiment, every match register of the match/capture module 210 has a 4-bit wide companion register 422 associated with it. This match companion register contains the fractional component of the match value, which specifies the number of timer cycles (zero to fifteen) out of every sixteen timer cycles that assertion of a counter match to this register will be delayed by one timer/counter clock. The match companion register is configured to receive a timer clock signal "timer_clk" from a corresponding timer/counter of the counter unit 208 and a reload signal "reload." The reload register is configured to receive a system bus clock signal "system bus_clk" and system bus data "BUS DATA" from, for example, a central processing unit (CPU).

The dither engine 422 in FIG. 4 is built around a dedicated dither cycle counter 430 that cycles continuously through different states. In an embodiment, the dither cycle counter is a 4-bit counter that cycles continuously through sixteen states (0 to 15). Typically, the dither cycle counter is incremented each time a corresponding timer/counter of the counter unit 208 reaches zero and begins a new cycle. Therefore, the dither cycle counter effectively counts cycles of the corresponding timer/counter. The start of each new timer/counter cycle of the dither cycle counter is also referred to as the "reload" point because it is also the moment when both the match registers of the match/capture module 210 and the match companion registers 426 are reloaded with new values from their respective shadow/reload registers. The reload signal "reload" that accomplishes the updating of the match registers and the match companion registers is also used to generate the count-enable signal to the dither cycle counter.

The outputs of the dither cycle counter 430 and each of the match companion registers 426 are presented to a dither algorithm logic circuit 432 that implements the dither algorithm. Each dither algorithm logic circuit of the dither module 420 determines in which specific timer cycles the assertion of the match is to be delayed. The algorithm that the dither algorithm logic circuit implements is designed to distribute the cycles in which dithering occurs relatively evenly across the set of timer cycles. In a particular implementation, the distribution pattern of dithering is as described in the table below.

| Match Companion Register/Counter Cycle | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0000 |   |   |   |   |   |   |   |   |   |   |   |   |   |   |   |   |
| 0001 |   |   |   |   |   |   |   |   | D |   |   |   |   |   |   |   |
| 0010 |   |   |   |   | D |   |   |   |   |   |   |   | D |   |   |   |
| 0011 |   |   |   |   | D |   |   |   | D |   |   |   | D |   |   |   |
| 0100 |   |   | D |   |   |   | D |   |   |   | D |   |   |   | D |   |
| 0101 |   |   | D |   |   |   | D |   | D |   | D |   |   |   | D |   |
| 0110 |   |   | D |   | D |   | D |   |   |   | D |   | D |   | D |   |
| 0111 |   |   | D |   | D |   | D |   | D |   | D |   | D |   | D |   |
| 1000 |   | D |   | D |   | D |   | D |   | D |   | D |   | D |   | D |
| 1001 |   | D |   | D |   | D |   | D | D | D |   | D |   | D |   | D |
| 1010 |   | D |   | D | D | D |   | D |   | D |   | D | D | D |   | D |
| 1011 |   | D |   | D | D | D |   | D | D | D |   | D | D | D |   | D |
| 1100 |   | D | D | D |   | D | D | D |   | D | D | D |   | D | D | D |
| 1101 |   | D | D | D |   | D | D | D | D | D | D |   | D | D | D | D |
| 1110 |   | D | D | D | D | D | D | D |   | D | D | D | D | D | D | D |
| 1111 |   | D | D | D | D | D | D | D | D | D | D | D | D | D | D | D |

The above table shows the timer/counter cycles in which dithering (delayed match) will occur for each value programmed into a particular match companion register 426. The top row of the table shows 16 different counter cycles (0-15) and the left column of the table contains 16 different match companion registers (0000-1111). Each match companion register contains the fractional portion associated with a particular match register and specifies the particular cycle number out of 16 cycles that the match assertion will be delayed by one clock. A "D" in the table indicates those cycles where the delayed match will be asserted. The dither cycle counter 430 keeps track of the counter cycles.

The output of each dither algorithm logic circuit 432 is a "Delay_Match" signal. There is one such "Delay_Match" signal for each match register. The "Delay_Match" signal controls a 2:1 multiplexor 434 that selects between a raw match signal "raw_match" from a comparator (not shown) of the match/capture module 210 and a one-clock delayed version "delayed_match" of the raw match signal from a latch 436 that is configured to perform the delay function based on the raw match signal and a timer clock signal "timer_clk" from a corresponding timer/counter of the counter unit 208. The multiplexor outputs a match signal "match," for example, to the application hardware 130 (shown in FIG. 1). The following logic expression represents a simple logic circuit that can implement the dither algorithm (i.e., the distribution of dither cycles per the table shown above).

Delay_Match<=FRACMAT(3) AND CYCLE_COUNTER(0)

OR FRACMAT(2) AND CYCLE_COUNTER(1 DOWNTO 0)="10"
OR FRACMAT(1) AND CYCLE_COUNTER(2 DOWNTO 0)="100"
OR FRACMAT(0) AND CYCLE_COUNTER="1000,"
where "FRACMAT" represents values stored in corresponding match companion registers and "CYCLE_COUNTER" represents the output value of the dither cycle counter 430. The above logic expression is trivial to describe in register-transfer level (RTL) and takes very few logic gates while still meeting the goal of an even distribution of dither cycles.

The dither module 220 provides for an additional measure of control over when dithering (match-delays) can occur using pre-defined events that may occur during the preceding timer/counter cycle. The definition of an event will differ depending on the design of the particular timer module involved. In an embodiment, an event can be defined as a match to a particular match register and/or a specified transition on a designated input or output signal, qualified with the value of a state variable from the state logic module 216.

In an embodiment, the function of the event qualification is to enable the dither cycle counter 430 to advance. In particular, in the absence of a qualifying event, the dither cycle counter stalls. The event qualification can have different results, depending on whether delaying of a match in the current cycle of the dither cycle counter is dictated by a selected dither pattern or not and depending on what is dictated by the pattern for the next cycle of the dither cycle counter. If the current cycle does specify dithering (match delay) and no event occurs, the dithering will continue to be applied for all subsequent cycles until a new qualifying event occurs. When that qualifying event does occur, the dither cycle counter will be allowed to advance to the next cycle. The selected dither pattern then may or may not call for dithering in that new cycle. Conversely, if the current cycle of the dither cycle counter is not a dithering cycle, no dithering will be applied and dithering cannot resume until a qualifying event occurs. In summary, whether or not dithering is applied in a cycle of the dither cycle counter after a qualifying event occurs depends on a selected dither pattern.

In the embodiment depicted in FIG. 4, the dither engine 422 also includes a dither events register 438. Each bit in the dither events register corresponds to an event that can be defined in the event generation module 212. In an embodiment, the dither events register contains all zeroes by default and the dither cycle counter 430 advances to the next count in the dither pattern every time a corresponding timer/counter of the counter unit 208 reaches zero (i.e. at the start of every new timer/counter cycle). The advancement through the dither pattern is qualified with designated events stored in the dither events register. Setting one or more of the bits in dither events register to "1"s will cause the dither engine to advance to the next element in the dither pattern (i.e. increment the dither cycle counter) only following timer/counter cycles during which one or more of the designated dither events have occurred. In the embodiment depicted in FIG. 4, the dither events register receives a system bus clock signal "system bus_clk" and system bus data "BUS DATA" from, for example, a CPU.

In an example set of operations, the outputs "dither events" of the dither events register 438 are continuously compared at a comparator 440 to the set of current events "events" coming from the event generation module 212 of the counter/timer circuit 200. In the embodiment depicted in FIG. 4, the comparison result "dither_event" from the comparator, the reload signal "reload" and a timer clock signal "timer_clk" from a corresponding timer/counter of the counter unit 208 are input into a latch 442, which generates a latch result "dither_event_latched" based on the received signals. If any dither-qualifying event occurs at any time during a timer/counter cycle, it is latched in the latch 442 and held until the next reload point at the end of the cycle.

The output "dither_event_latched" of the latch 442 is ORed in an OR gate 446 with the comparison result "dither_event" from the comparator 440 and the processing result of multi-bits dither events signal at an NOR gate 444. The output of the OR gate is ANDed in an AND gate 448 with a reload signal to enable the dither cycle counter 430 to increment. In the embodiment depicted in FIG. 4, the dither cycle counter receives the logic result from the AND gate 448 and a timer clock signal "timer_clk" from a corresponding timer/counter of the counter unit 208. If none of the bits in the dither events register are set (i.e., the default condition), this input to the AND gate are forced to "1" and the dither cycle counter is enabled to increment on every reload point.

Although the dither module 420 is illustrated in FIG. 4 as including certain circuit elements, in some embodiments, the dither module 420 may include different circuit elements. In addition, although the components of the dither module 420 may be described as having a particular size/bit width, in some embodiments, the components of the dither module 420 may have a different size/bit width. For example, the companion register 422 and the dither cycle counter may have 8 bits, 16 bits, or other suitable number of bits.

Figure 5:
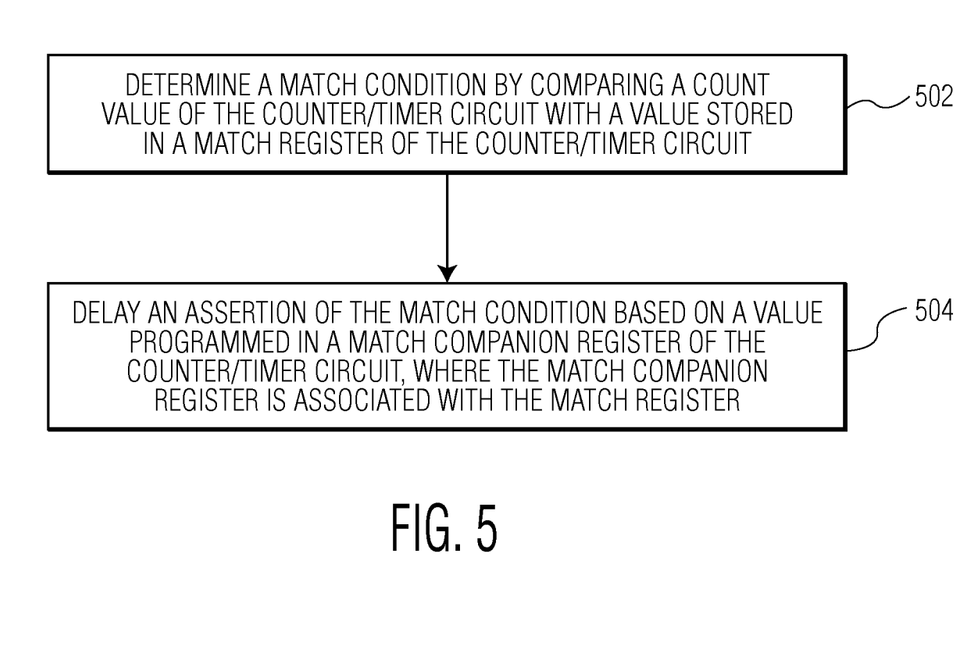
FIG. 5 is a process flow diagram of a method of operating a counter/timer circuit in accordance with an embodiment of the invention.

A method for operating a counter/timer circuit in accordance with an embodiment of the invention is described with reference to a process flow diagram of FIG. 5. The counter/timer circuit may be similar to or the same as the counter/timer circuit 100 depicted in FIG. 1 or the counter/timer circuit 200 depicted in FIG. 2. At block 502, a match condition is determined by comparing a count value of the counter/timer circuit with a value stored in a match register of the counter/timer circuit. At block 504, an assertion of the match condition is delayed based on a value programmed in a match companion register of the counter/timer circuit, where the match companion register is associated with the match register.

Although the operations of the method herein are shown and described in a particular order, the order of the operations of the method may be altered so that certain operations may be performed in an inverse order or so that certain operations may be performed, at least in part, concurrently with other operations.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method of operating a counter/timer circuit, the method comprising:
    determining a match condition by comparing a count value of the counter/timer circuit with a value stored in a match register of the counter/timer circuit; and
    after the match condition is determined, delaying an assertion of the match condition based on a value programmed in a match companion register of the counter/timer circuit that specifies a cycle number in which the match assertion will be delayed, wherein the match companion register is associated with the match register, wherein at least one of determining the match condition and delaying the assertion of the match condition is executed by a computing machine.

2. The method of claim 1, further comprising generating event signals within the counter/timer circuit, wherein the delaying the assertion of the match condition comprises delaying the assertion of the match condition when at least one of the event signals satisfies a predefined condition.

3. The method of claim 2, wherein the delaying the assertion of the match condition comprises delaying the assertion of the match condition for one timer clock of the counter/timer circuit after the match condition has occurred.

4. The method of claim 2, wherein the delaying the assertion of the match condition comprises allowing a dither cycle counter to advance to a next element in a dither pattern array when the at least one of the event signals satisfies the predefined condition.

5. The method of claim 2, wherein the generating the event signals comprises generating the event signals based on at least one of:
    an input signal of the counter/timer circuit,
    an output signal of the counter/timer circuit, and
    a previous match condition of the counter/timer circuit.

6. The method of claim 1 further comprising distributing timer cycles in which the assertion of the match condition will be delayed across all of the timer cycles of the counter/timer circuit.

7. The method of claim 1, wherein the match condition is asserted by generating a timer match signal that is used to trigger an operation of application hardware.

8. The method of claim 1, wherein the delaying the assertion of the match condition comprising:
    generating a timer match signal that is used to trigger an operation of application hardware;
    delaying the timer match signal for one timer clock of the counter/timer circuit; and
    outputting the delayed timer match signal.

9. The method of claim 8, wherein the operation of the application hardware includes constructing a pulse-width modulated waveform.

10. The method of claim 1, wherein the determining the match condition comprises determining the match condition when the counter value is equal to the value stored in the match register.

11. A counter/timer circuit comprising:
    a counter;
    a match module configured to determine a match condition by comparing a count value of the counter with a value stored in a match register of the counter/timer circuit; and
    a dither module configured to, after the match condition is determined, delay an assertion of the match condition based on a value programmed in a match companion register of the counter/timer circuit that specifies a cycle number in which the match assertion will be delayed, wherein the match companion register is associated with the match register.

12. The counter/timer circuit of claim 11 further comprising an event generation module configured to generate event signals, wherein the dither module is further configured to delay the assertion of the match condition when at least one of the event signals satisfies a predefined condition.

13. The counter/timer circuit of claim 12, wherein the dither module is further configured to delay the assertion of the match condition for one timer clock of the counter after the match condition has occurred.

14. The counter/timer circuit of claim 12, wherein the dither module comprises a dither cycle counter configured to advance to a next element in a dither pattern array when the at least one of the event signals satisfies the predefined condition.

15. The counter/timer circuit of claim 12, wherein the event generation module is further configured to generate the event signals based on at least one of:
 an input signal of the counter/timer circuit,
 an output signal of the counter/timer circuit, and
 a previous match condition of the counter/timer circuit.

16. The counter/timer circuit of claim 11, wherein the dither module is further configured to distribute timer cycles in which the assertion of the match condition will be delayed across all of the timer cycles of the counter.

17. The counter/timer circuit of claim 11, wherein the dither module is further configured to generate a timer match signal that is used to trigger an operation of application hardware.

18. The counter/timer circuit of claim 11, wherein the dither module is further configured to:
 generate a timer match signal that is used to trigger an operation of application hardware;
 delay the timer match signal for one timer clock of the counter; and
 output the delayed timer match signal.

19. The counter/timer circuit of claim 18, wherein the operation of the application hardware includes constructing a pulse-width modulated waveform.

20. The counter/timer circuit of claim 11, wherein the dither module is further configured to determine the match condition when the counter value is equal to the value stored in the match register.

* * * * *